United States Patent [19]

Kuo

[11] Patent Number: 5,106,768
[45] Date of Patent: Apr. 21, 1992

[54] METHOD FOR THE MANUFACTURE OF CMOS FET BY P+ MASKLESS TECHNIQUE

[75] Inventor: Kuo-Yun Kuo, Hsin-Chu, Taiwan

[73] Assignee: United Microelectronics Corporation, Hsinchu, Taiwan

[21] Appl. No.: 575,846

[22] Filed: Aug. 31, 1990

[51] Int. Cl.[5] .......................................... H01L 21/265
[52] U.S. Cl. ........................................ 437/34; 437/28;
437/29; 437/58; 437/247; 437/979; 148/DIG.
82; 148/DIG. 116; 148/DIG. 163
[58] Field of Search ..................... 437/34, 58, 28, 979,
437/29, 247; 148/DIG. 116, DIG. 117, DIG.
82, DIG. 163

[56] References Cited

U.S. PATENT DOCUMENTS

| | | | |
|---|---|---|---|
| 4,474,624 | 10/1984 | Matthews | 437/34 |
| 4,480,375 | 11/1984 | Cottrell et al. | 437/34 |
| 4,675,978 | 6/1987 | Swartz | 148/DIG. 18 |

Primary Examiner—Brian Hearn
Assistant Examiner—Tuan Nguyen

[57] ABSTRACT

The present method uses a one block out mask method for forming both the N channel and P channel MOS field effect transistors by providing a special oxidizing method that grows sufficient silicon oxide upon the already formed N+ source/drain regions which is sufficient to block the P+ ion implantation which forms the P channel device from the N channel device area.

11 Claims, 1 Drawing Sheet

METHOD FOR THE MANUFACTURE OF CMOS FET BY P+ MASKLESS TECHNIQUE

BACKGROUND OF THE INVENTION

1. Field of the Invention

The invention is directed to a method for manufacturing complementary MOS field effect transistors that is useful in the micron and submicron technology and more particularly to use of a P+ ion implantation to form the P channel devices using a maskless technique.

2. Description of the Prior Art

The complimentary MOS field effect transistor process has more steps to complete than either the N channel or P channel process. With this greater complexity, there is clearly a yield loss. The complexity comes with additional masks.

The conventional complimentary MOS field effect transistor process uses two block out masks. One of these masks is used to block out the designated P channel regions from unwanted ion implantation during the N channel ion implantation steps. The second mask is used to block out the designated N channel regions from unwanted ion implantation during the P channel ion implantation steps. The details of this conventional process can be generally seen from the H. J. Levinstein et al. U.S. Pat. No. 4,555,842 and W. Mueller, U.S. Pat. No. 4,760,033.

Workers in the field have tried to reduce these number of steps. One attempt is described in the "VLSI Technology" Second Edition by S. M. Sze Published by McGraw-Hill International Editions, 1988 on pages 485, 486 wherein a single block out mask is used. The described process provides the silicon substrate with N wells and P wells, and gate dielectric/gate electrode structures over the designated channel regions for the N channel and P channel devices. The P type impurity, boron is implanted nonselectively into all the sources and drains. This is followed with a selective, that is using a block out mask over designated P channel regions, implant of phosphorus or arsenic into the N channel source/drain regions at a higher dose, so that it overcompensates the boron. After the subsequent thermal cycles, the phosphorus or arsenic completely covers the boron vertically and laterally. Nevertheless, the unwanted boron ions do exist in the N channel regions when this method is used.

It is therefore a principal object of this invention to describe a process that uses only one block out mask to form a complementary MOS field effect transistor while keeping the unwanted P type ions in the N channel source/drain regions to a bare minimum.

SUMMARY OF THE INVENTION

The present invention uses a one block out mask method for forming both the N channel and P channel MOS field effect transistors by providing a special oxidizing method that grows sufficient silicon oxide upon the already formed N+ source/drain regions which is sufficient to block the P+ ion implantation which forms the P channel device from the N channel device area.

In accordance with the present invention there is provided a method for making the complementary MOS field effect transistors while using a maskless P+ ion implantation wherein there is sufficient silicon oxide grown over the N+ regions to protect them from the P+ ion penetration into the N+ regions. The method begins with the provision of a silicon substrate doped with a dopant of a first conductivity. The substrate has P and/or N wells formed therein, field oxide regions separating the planned active transistor regions, and gate dielectric/gate electrode structures over the designated channel regions for the N channel and P channel device. A block out mask is formed over the non-planned N channel regions. N+ type ions are ion implanted into the P doped regions in the substrate to form the N+ source/drain regions for the N channel transistor. The block out mask is removed. The structure is annealed at an elevated temperature to perpare the surface for controlable silicon oxide growth. The exposed surfaces are oxidized at a temperature between about 800° to 875° C. in an oxidizing atmosphere to nonuniformly oxidize the said surfaces wherein the P/N− doped surfaces grow a much thinner silicon oxide than grown on the N+ doped surfaces. P+ type ions are implanted into the N doped regions in the substrate at an energy that allows the said ions to pass through said thinner silicon oxide while being substantially blocked by the silicon oxide grown upon the N+ doped surfaces to form the P+ source/drain regions for the P channel transistor. The appropriate passivation and metallurgy are provided to electrically connect the complementary MOS field effect transistor into a desired circuit.

Further in accordance with the present invention there is shown a complementary MOS field effect transistor device which is fabricated with reduced masks. A silicon substrate is provided that is doped with a dopant of a first conductivity. The substrate has P wells formed therein, field oxide regions separating the planned active transistor regions, and gate dielectric/gate electrode structures over the designated channel regions for the N channel and P channel devices. N+ source/drain regions for the N channel transistor are located in P type regions. Nonuniform silicon oxide covers the surfaces wherein the P/N− doped surfaces have a much thinner silicon oxide than on the N+ doped surfaces. P+ source/drain regions for the P channel transistor are located in N type regions. The appropriate passivation and metallurgy is provides over the top surfaces to electrically connect the complementary MOS field effect transistor into a desired circuit.

DESCRIPTION OF THE PREFERRED EMBODIMENTS

Figure 1:
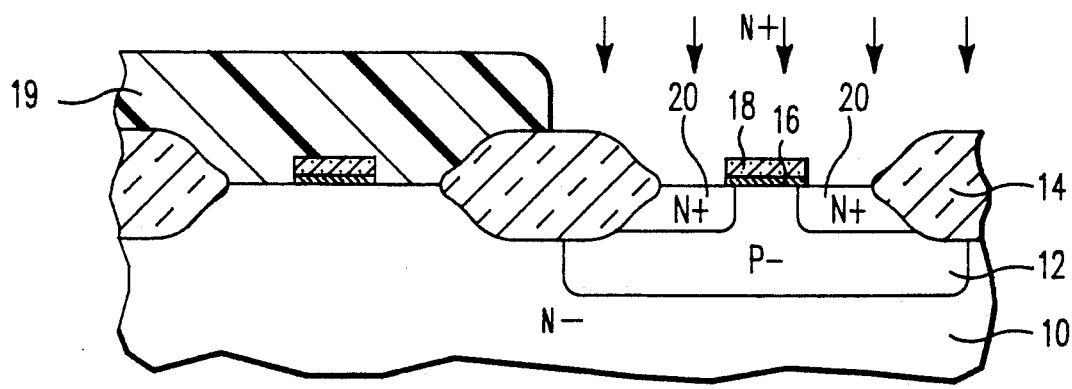
FIGS. 1 through 4 schematically show in cross section one embodiment of the P+ markless process for fabricating a complementary MOS field effect transistor of the present invention.

Referring now to FIG. 1, the first series of steps involve the formation of the dielectric isolation regions for isolating semiconductor surface regions from other such regions. The semiconductor substrate 10 is preferably composed of silicon having a (100) crystallographic orientation. The substrate 10 in this example is doped N− as seen in FIG. 1. The substrate could alternatively have an epitaxial grown layer of N− doped monocrystalline silicon thereon. The dielectric isolation regions 14 may be formed by the various conventional methods understood by those skilled in the field. One method is described by E. Kooi in U.S. Pat. No. 3,970,486 wherein the certain selected surface portions of a silicon semiconductor substrate is masked against oxidation, and then the exposed unmasked surface is oxidized to grow a thermal oxide which in effect sinks the silicon surface at the unmasked areas. The masked silicon remains as a mesa surrounded by the sunken oxide. Then semiconductor devices can be provided by various known techniques in the silicon mesas.

The P and/or N wells are formed in the surface of the substrate for the planned N channel or P channel devices. In this embodiment, there is shown only the P− well 12 for the N channel device to be formed. This well is formed by conventional ion implantation of boron B11 ions at dosage of between about $1.0 \times 10^{13}$ to $1.6 \times 10^{13}$ atoms/cm.$^2$ and energy of about 100 Kev. For a twin well ion implantation process the P well implant uses B11 with a dosage of between about $7.0 \times 10^{12}$ to $1.0 \times 10^{13}$ atoms/cm.$^2$ with an energy of about 150 and the N well implant uses P31 with a dosage of between about $1.0 \times 10^{12}$ to $1.3 \times 10^{12}$ atoms/cm.$^2$ with an enegy of about 150 Kev.

The gate dielectric silicon oxide is thermally grown in a suitable oxidizing atmosphere to a thickness of between about 43.5 to 49.5 nanometers on the exposed silicon surfaces for a P well 3 micrometer process and between about 22.5 to 27.5 nanometers for a twin well 2 micrometer process. A layer of polysilicon is then deposited by conventional silane deposition at about 575° to 650° C. The layer has a thickness of between about 500 to 600 nanometers for the P well 3 micrometer process and between about 420 and 480 nanometers for a twin well 2 micrometer process. The layer is now doped with phosphorus by ion implantation to a sheet resistance of between about 12 to 15 ohms/square for the 3 micrometer process and between about 8 to 12 ohms/square for the 2 micrometer process. The layers are patterned using conventional lithography and etching techniques to form the gate oxide 16 and gate electrode 18 for both the N channel and P channel devices as shown in FIG. 1.

The N+ source/drain regions are now formed. The block out mask 19 is formed of resist material over the planned P channel device areas. It is formed by conventional lithography and etching techniques. The block out mask 19 blocks the N+ phosphorous or arsenic ions which are shown by the arrows in FIG. 1 from reaching the P channel regions. The N+ ions are implanted into the desired locations of the source/drain regions 20 of the N channel transistor. The resist block out mask 19 is removed by conventional techniques, such as by oxygen ashing to produce the FIG. 2 structure.

Figure 2:
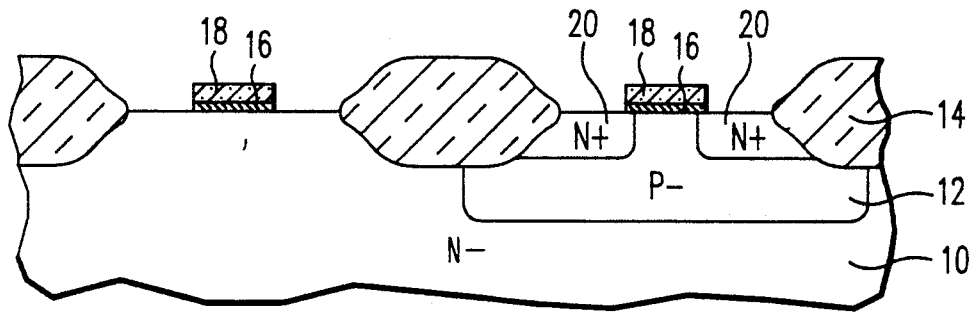

The FIG. 2 structure must now be specially prepared for the P+ maskless process of the invention. The N+ regions are completed by drive in steps that include heating the structure for about 20 to 30 minutes in nitrogen and low oxygen at a temperature of about 1000° C. Annealing in oxygen produces too thick a layer of silicon oxide. This produces a silicon dioxide of about nanometers on N+ regions, nanometers on P+ regions, and nanometers on P/N− regions. This process also necessary to prepare the surfaces for the main silicon oxide growth step. Without this preparation, the silicon oxide formed in the next step would be nonuniform from wafer to wafer.

Figure 3:
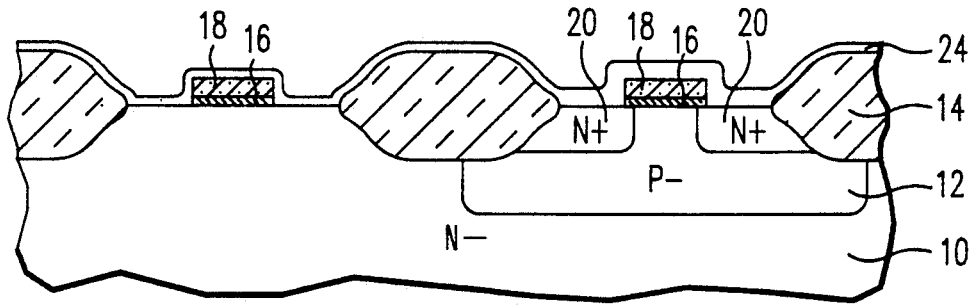

The next step may be seen with reference to FIG. 3. The FIG. 2 structure is now subjected to a thermal oxidation in wet oxygen at a temperature between about 800° and 875° C. for a period of minutes. The length of time depends upon the temperature, the higher the temperature in the range the shorter the time necessary for the desired oxidation of the silicon. For example, oxidation at 810° C. would take 12 minutes and oxidation at 860° C. would take 6 minutes. It is desired to have the silicon oxide layer 24 to be on the N+ regions to be between about 80 to 120 nanometers, and on the P/N − regions to be between about 20 to 30 nonometers. The process conditions are made to meet these thickness ranges. The desire is to form the needed mask thickness for P+ ion implantation over the N+ regions.

Figure 4:
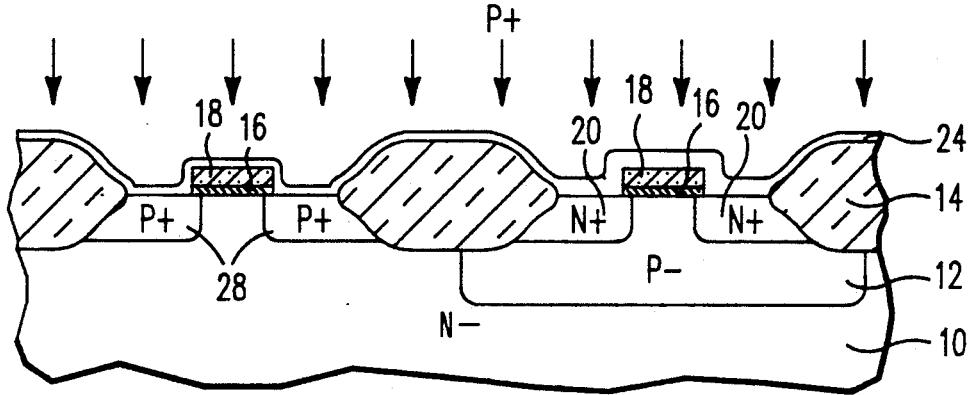

The next step is shown in FIG. 4 wherein the P+ ion implantation, as shown by the arrows in done so as to form the P+ source/drain regions 28 without using a resist block out mask. It is preferred to use boron fluoride, BF$_2$ as the P+ ion source, because it is blocked by the silicon oxide layer over the N+ regions when using the usual energy of from 70 to 90 Kev. The boron fluoride is also preferred, because it overcomes the channeling problem for P+ device channels. However, with this layer 24 thickness, it is possible to use B+ as the P+ ion source by reducing the energy to less than about 20 Kev. The result of the process is junction depths for the P channel device of micrometers and for the N channel device of micrometers. This completes the FIG. 4 structure.

The final series of steps involve the desposition of passivation and metallurgy layers to electrically contact the elements of the complementary MOS field effect transistor and connect these elements to form the desired circuits on the integrated circuit chip desired. These are done by conventional deposition, lithography, and etching steps that are well understood by those in the art.

The following examples are given to point out the important features of the present invention and to aid in the understanding thereof and variations may be made by one skilled in the art without departing from the spirit and scope of the invention.

EXAMPLE I

The silicon surface was not annealed at a temperature of 1000° C. A silicon oxide was grown upon the silicon surfaces which had regions of N+ and P+ under the conditions of 810° C. for 12 minutes. The silicon oxide grown on the N+ regions ranged from 140 to 200 nanometers and that grown on the P+ regions ranged from 35 to 40 nanometers. The following Table I gives the ratios of the N+ silicon oxide to the P+ silicon oxide at the locations in the quartz boat or tube in the furnance—that is out (away from the source of the nitrogen, oxygen), center and in (at the source end of the nitrogen, oxygen) versus time of oxidation.

TABLE I

| time (minutes) | position | | |
| --- | --- | --- | --- |
| | out | center | in |
| 10 | 2.4 | 4.7 | 7.1 |
| 12 | 3.8 | 5.1 | 6.8 |
| 15 | 2.6 | 3.3 | 4.2 |
| 25 | 2.9 | 3.4 | 4.8 |
| 30 | 2.2 | 2.2 | 2.9 |
| 60 | 2.8 | 2.9 | 3.6 |

The ratio N+ oxide/P+ oxide results should have the same ratio whether in the out, center or in position for the given time. The results given in TABLE I shows that this is not the case without the high temperature anneal and preparation step.

EXAMPLE II

The method of EXAMPLE I was repeated using an annealing and preparation step either lean oxygen (nitrogen/oxygen) or oxygen and with the variation in P+ ion implantation. The TABLE II shows the results versus the N+ region resistance RN+ and P+ region resistance RP+ and the thickness of the resulting silicon oxide for P+ or N+. The normal process using two resist masks, rather than the P+ maskless process of the invention, is given for comparison.

TABLE II

|  | P+ I/I | RN+ | RP+ | TP+ (in A) | TN+ (in A) |
|---|---|---|---|---|---|
| Normal process | $4 \times 10^{15}$ | 26 | 87.4 | — | — |
| $N_2/O_2$ anneal | $4 \times 10^{15}$ | 31.1 | 97.9 | 200 | 1600 |
|  | $4 \times 10^{15}$ | 32.3 | 114.5 | 300 | 1800 |
| $O_2$ anneal | $4 \times 10^{15}$ | 27.9 | 129.5 | 380 | 1400 |
|  | $5 \times 10^{15}$ | 27.9 | 118.5 | 380 | 1400 |
|  | $6 \times 10^{15}$ | 28.7 | 105.3 | 380 | 1400 |
|  | $7 \times 10^{15}$ | 29.2 | 106.3 | 380 | 1400 |

The results of TABLE II show that oxygen anneal yields too thick P+ silicon oxide, or reduced N+ oxide/P+ ratio. The result is higher P+ resistance at the same dosage. The data also shows that with additional anneal, the oxide thickness is reproducible. The lean oxygen anneal (nitrogen/oxygen) is preferred.

EXAMPLE III

The process was performed as in EXAMPLE II and the P+ dopant, boron fluoride was varied according to the TABLE III. The implantation energy variation is shown in the TABLE III versus the resistance, RN+ in ohms for the N+ region and resistance, RP+ in ohms for the P+ region after the ion implantation.

TABLE III

|  | Energy (in Kev) | RN+ (in ohms) | RP+ |
|---|---|---|---|
| Normal process | 80 | 24.88 | 95.12 |
| Anneal | 70 | 25.8 | 175.0 |
| Anneal | 80 | 26.72 | 136.2 |
| Anneal | 90 | 27.4 | 118.3 |
| Non-anneal | 90 | 30.27 | 114.0 |

The above TABLE III shows the relationship between RN+, RP+ and the energy of boron fluoride implant. The higher the energy of boron fluoride the better improved is the RP+, that is there is more boron going through the silicon oxide layer into the P+ regions. However, this higher power degrades the RN+, since some more of the P+ ions will pass through the thick silicon oxide covering the N+ source/drain regions.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a complementary MOS field effect transistor with reduced masks comprising:
providing a monocrystalline silicon substrate doped with a dopant of a first conductivity;
said substrate having conductivity imparting wells formed therein to provide regions in said substrate which are N— doped and P— doped, field oxide regions separating the planned active transistor regions, and gate dielectric/gate electrode structures over the designated channel region for the N channel and P channel device;
forming a block out mask over the nonplanned N channel regions;
ion implanting N+ type ions into said P— doped regions in said substrate to form the N+ source/drain regions for the N channel transistor;
removing the said block out mask;
providing a lean oxygen anneal in an atmosphere of nitrogen and oxygen for the structure at an elevated temperature greater than about 980° C. to prepare the surface for controlable silicon oxide growth;
oxidizing the exposed surfaces at a temperature between about 800° to 875° C. in an oxidizing atmosphere to nonuniformly oxidize the said surfaces wherein the N— doped said exposed surfaces of said N— doped regions grow a much thinner silicon oxide than grown on the N+ doped surfaces of said N+ doped regions; and
ion implanting P+ type ions into said N— doped regions in said substrate at an energy that allows the said ions to pass through said thinner silicon oxide while being substantially blocked by the silicon oxide grown upon said N+ doped surfaces to form the P+ source/drain regions for the P channel transistor.

2. The method of claim 1 wherein said substrate is N type, has only P wells and said N+ type ion implanting is done into said P wells.

3. The method of claim 1 wherein said annealing is done at a temperature between about 980° to 1020° C. for more than about 25 minutes.

4. The method of claim 1 wherein said oxidizing at a temperature between about 800° to 840° C. in a wet oxygen atmosphere for more than about 6 minutes.

5. The method of claim 1 wherein said oxidizing of the exposed surfaces produces silicon oxide of at least 80 nanometers on said N+ regions and less than about 30 nanometers on said N— regions.

6. The method of claim 4 wherein said oxidizing of the exposed surfaces produces silicon oxide of between about 80 to 120 nanometers on said N+ regions and between about 20 to 30 nanometers on said N— regions.

7. The method of claim 1 wherein said P+ ions is $BF_2+$ having a dosage of between about $4 \times 10^{15}$ to $6 \times 10^{15}$ atoms/cm.$^2$ with an energy level of between about 70 to 90 Kev.

8. The method of claim 1 wherein said P+ ions is B+ having a dosage of between about $2 \times 10^{15}$ to $4 \times 10^{15}$ atoms/cm.$^2$ with an energy level of less than about 20 Kev.

9. A method for manufacturing a complementary MOS field effect transistor with reduced masks comprising:
providing a monocrystalline silicon substrate doped with a dopant of a first conductivity;
said substrate having P— doped well regions and N— doped regions formed therein, field oxide regions separating the planned active transistor regions, and gate dielectric/gate electrode structures over the designated channel regions for the N channel and P channel devices;
forming a block out mask over the planned P channel regions;

ion implanting N+ type ions into P doped well regions in said substrate to form the N+ source/drain regions for the N channel transistor;

removing the said block out mask;

providing a lean oxygen anneal in an atmosphere of nitrogen and oxygen for the structure at an elevated temperature of between about 980° and 1020° C. to prepare the surface for controlable silicon oxide growth;

oxidizing the exposed surfaces at a temperature between about 800° to 875° C. in an oxidizing atmosphere to nonuniformly oxidize the said surfaces wherein the N− doped said exposed surfaces of said N− doped regions grow a much thinner silicon oxide than grown on the N+ doped surfaces of said N+ doped regions; and ion implanting P+ type ions into N− doped regions in said substrate at an energy that allows the said ions to pass through said thinner silicon oxide while being substantially blocked by the silicon oxide grown upon said N+ doped surfaces to form the P+ source/drain regions for the P channel transistor.

10. The method of claim 9 wherein said oxidizing at a temperature between about 800° and 840° C. in a wet oxygen atmosphere for more than 6 minutes to produce silicon oxide of at least 80 nanometers on said N+ regions and less than about 30 nanometers on said N− regions.

11. The method of claim 10 wherein said P+ dopant is $BF_2+$ having a dosage of between about $4 \times 10^{15}$ to $6 \times 10^{15}$ atoms/cm.$^2$ with an energy level of between about 70 to 90 Kev.

* * * * *